(12) United States Patent
Ding et al.

(10) Patent No.: US 11,398,424 B2
(45) Date of Patent: Jul. 26, 2022

(54) SEMICONDUCTOR PACKAGE STRUCTURE

(71) Applicant: Advanced Semiconductor Engineering, Inc., Kaohsiung (TW)

(72) Inventors: Jaw-Ming Ding, Kaohsiung (TW); Ren-Hung Chou, Kaohsiung (TW); Yi-Hung Lin, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 123 days.

(21) Appl. No.: 16/793,989

(22) Filed: Feb. 18, 2020

(65) Prior Publication Data

US 2021/0257286 A1 Aug. 19, 2021

(51) Int. Cl.
| | |
|---|---|
| H01L 23/498 | (2006.01) |
| H01L 23/00 | (2006.01) |
| H01L 23/552 | (2006.01) |
| H01L 23/31 | (2006.01) |

(52) U.S. Cl.
CPC .... *H01L 23/49838* (2013.01); *H01L 23/3121* (2013.01); *H01L 23/49822* (2013.01); *H01L 23/49827* (2013.01); *H01L 23/552* (2013.01); *H01L 24/67* (2013.01); *H01L 2924/1811* (2013.01); *H01L 2924/3025* (2013.01)

(58) Field of Classification Search
None
See application file for complete search history.

(56) References Cited

U.S. PATENT DOCUMENTS

| | | | | |
|---|---|---|---|---|
| 10,433,469 | B1 * | 10/2019 | Lee | H05K 9/0094 |
| 2009/0002967 | A1 * | 1/2009 | Asami | H01L 24/97 |
| | | | | 361/816 |
| 2019/0035716 | A1 * | 1/2019 | Kita | H01L 23/3121 |
| 2019/0281736 | A1 * | 9/2019 | Lee | B32B 17/10 |
| 2021/0257286 | A1 * | 8/2021 | Ding | H01L 23/49838 |
| 2021/0335733 | A1 * | 10/2021 | Hong | H01L 23/66 |

* cited by examiner

*Primary Examiner* — Long Pham
(74) *Attorney, Agent, or Firm* — Foley & Lardner LLP

(57) ABSTRACT

A semiconductor package structure includes a substrate. The substrate includes a first ground layer. The first ground layer has a body and a first tooth protruding from a side of the body. The first tooth has a first lateral side. The first lateral side of the first tooth is inclined relative to the side of the body in a top view of the first ground layer.

19 Claims, 15 Drawing Sheets

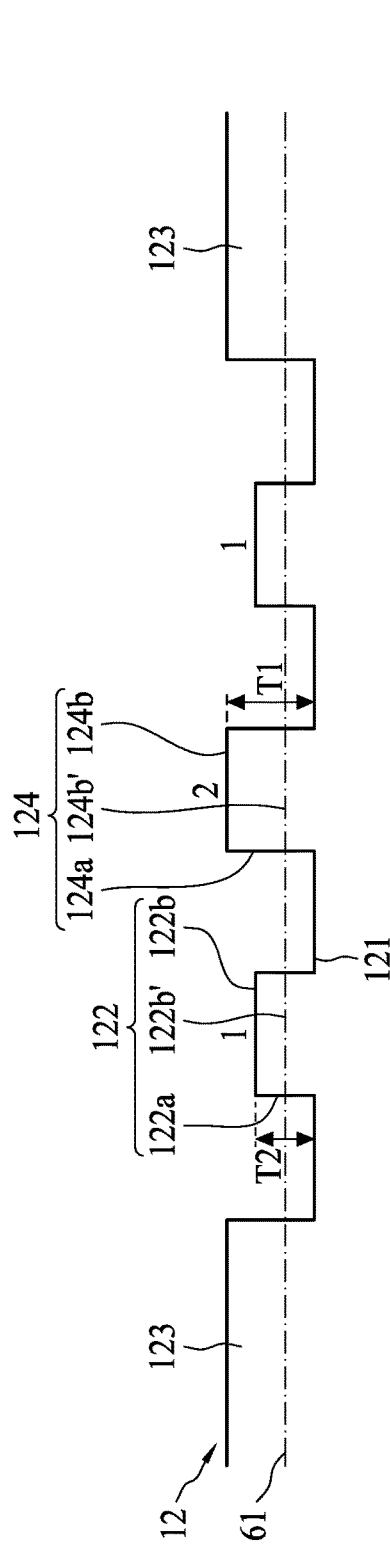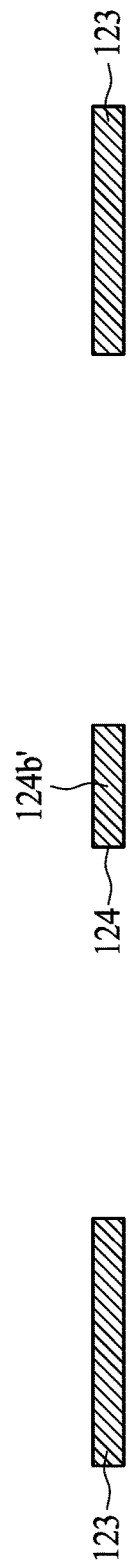

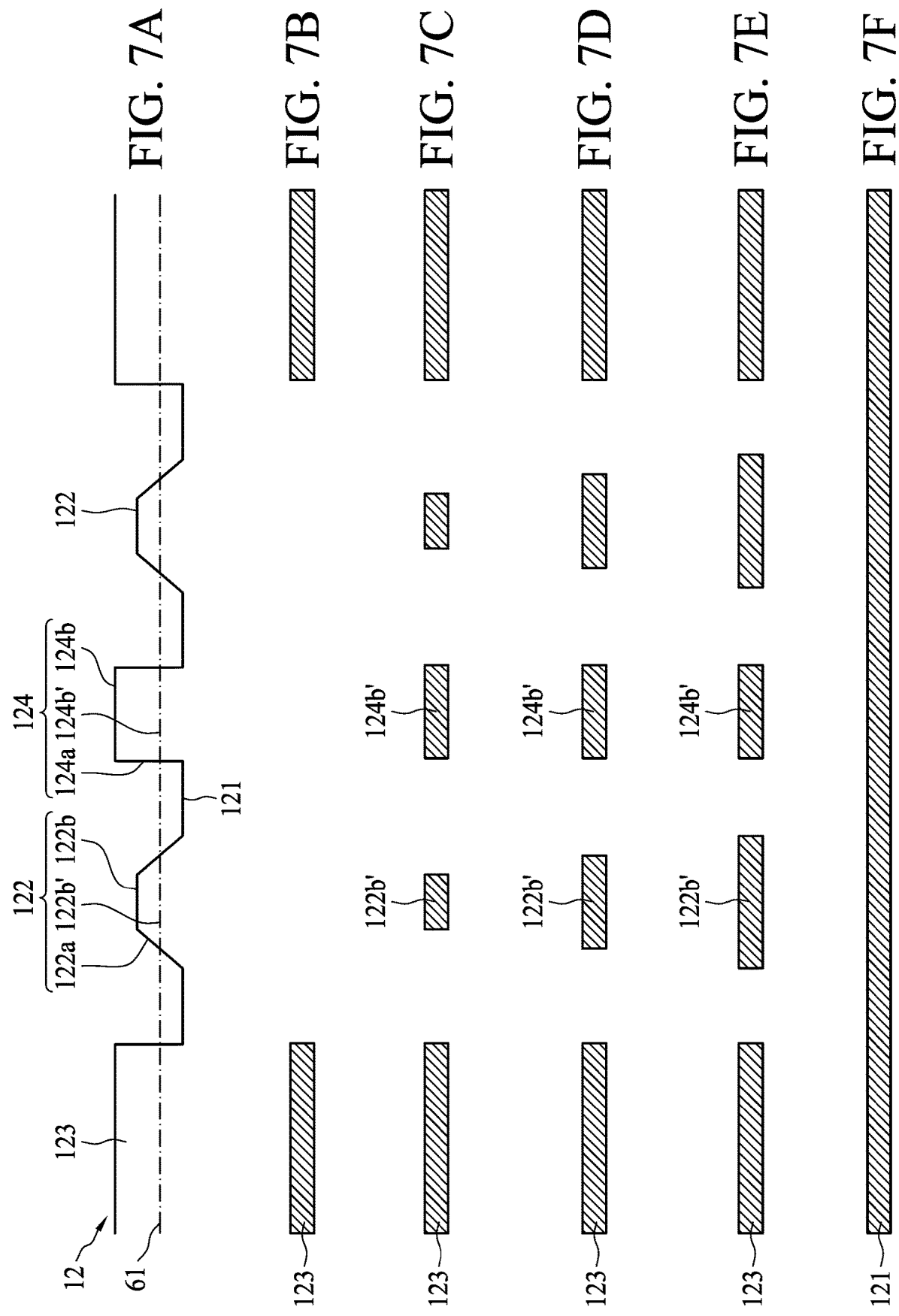

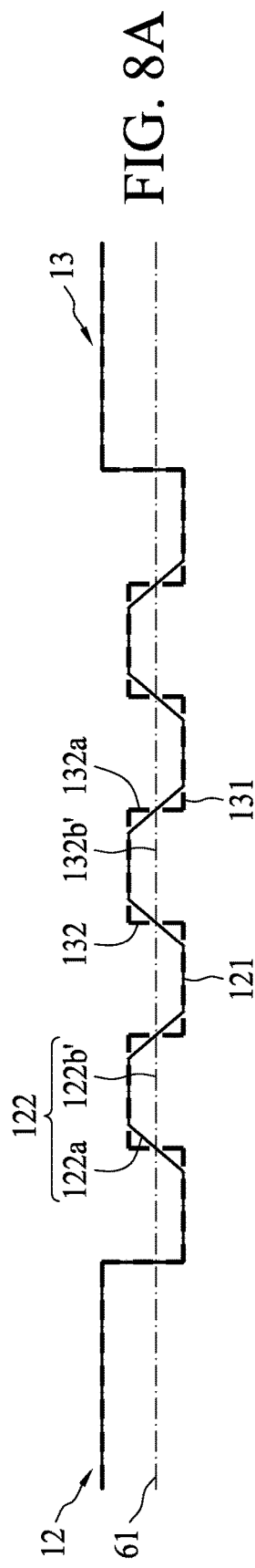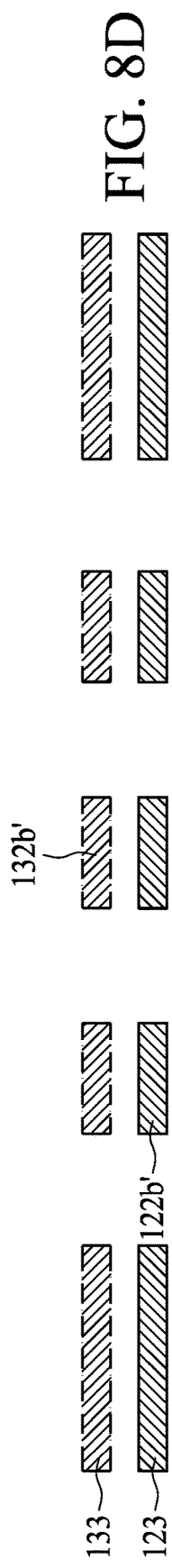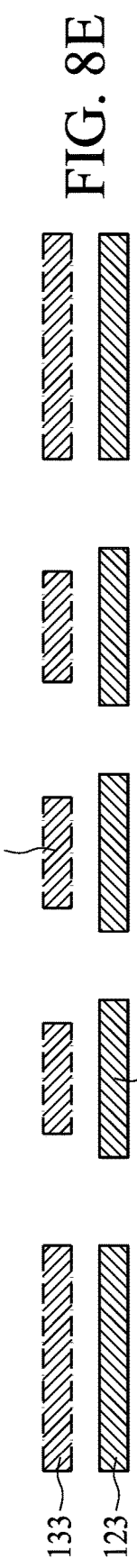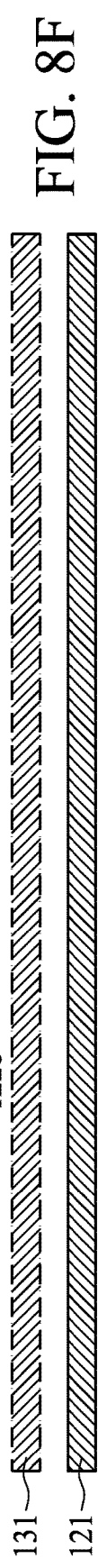

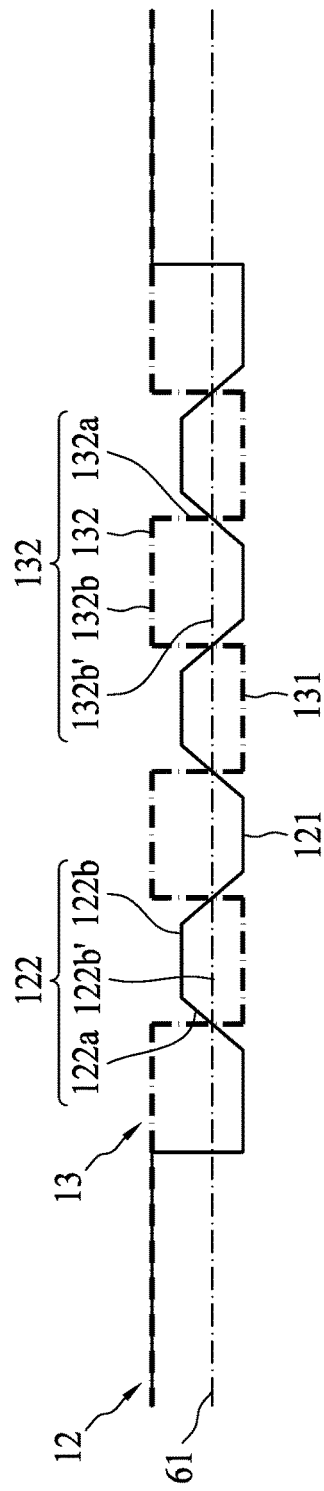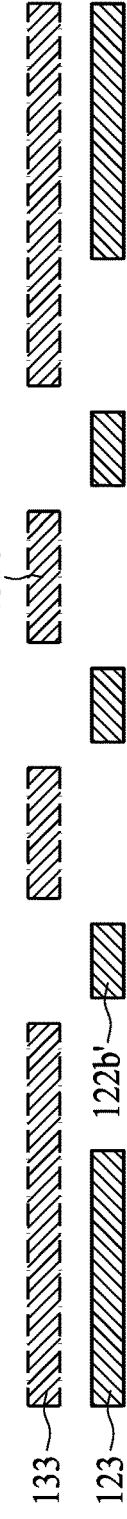

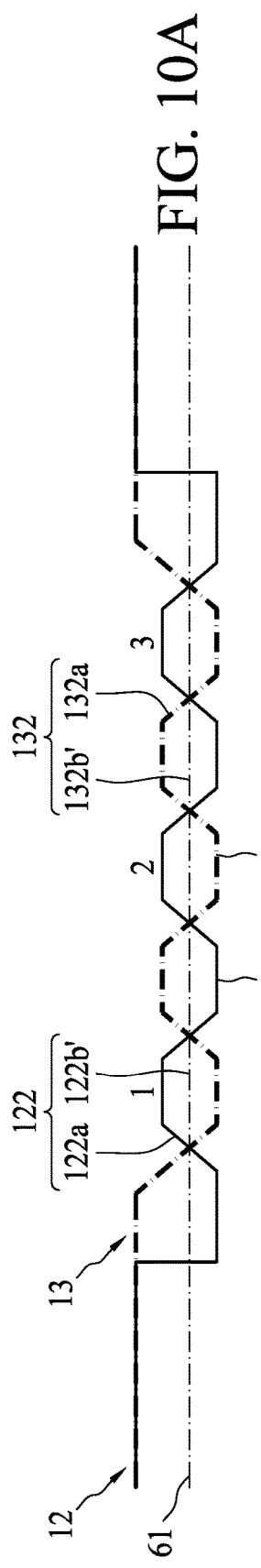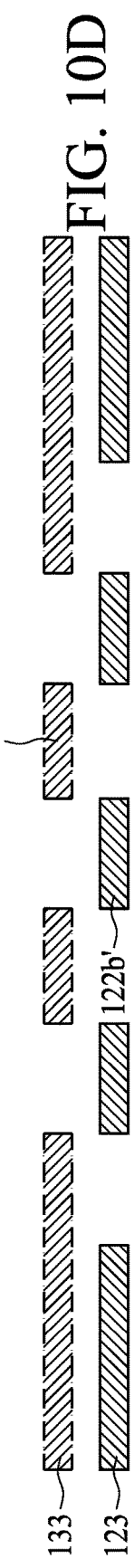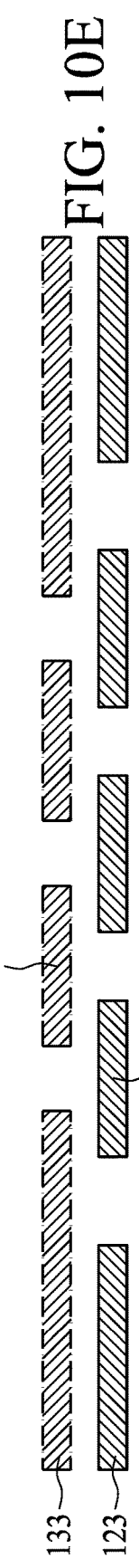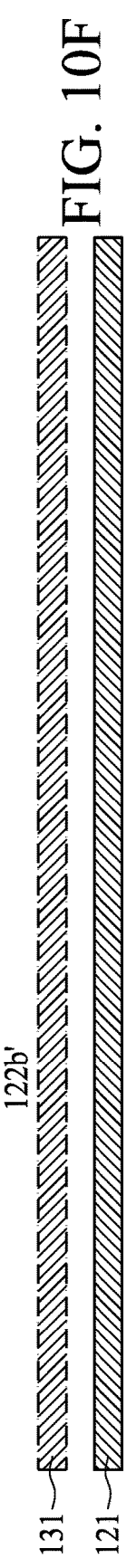

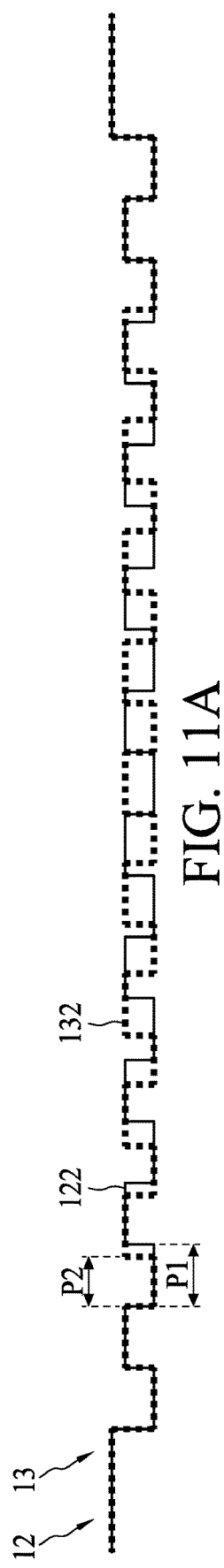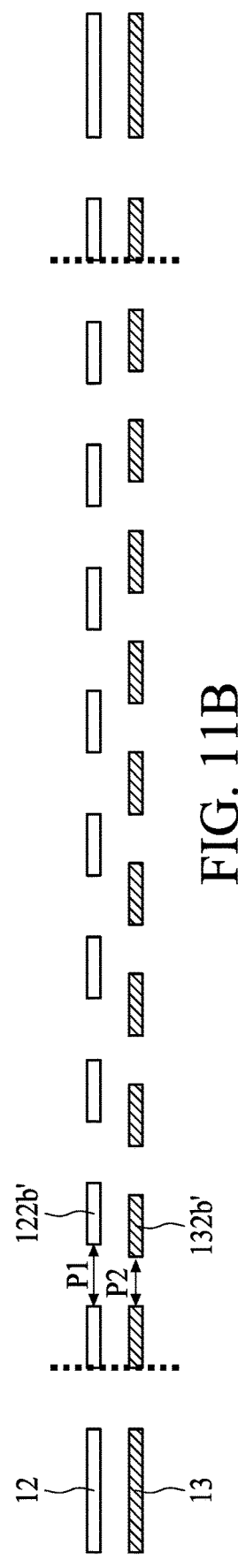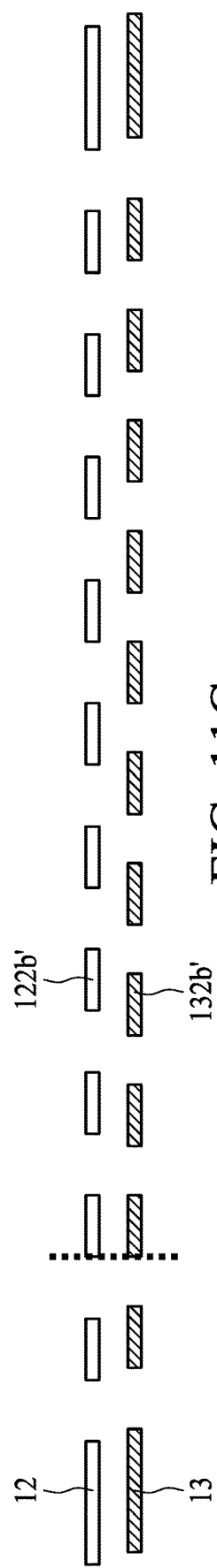

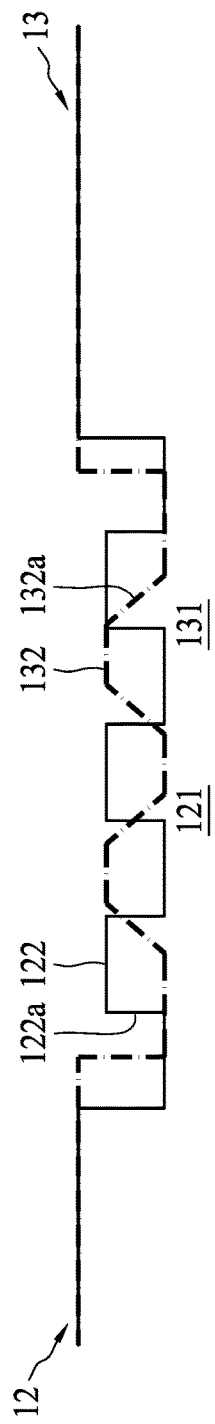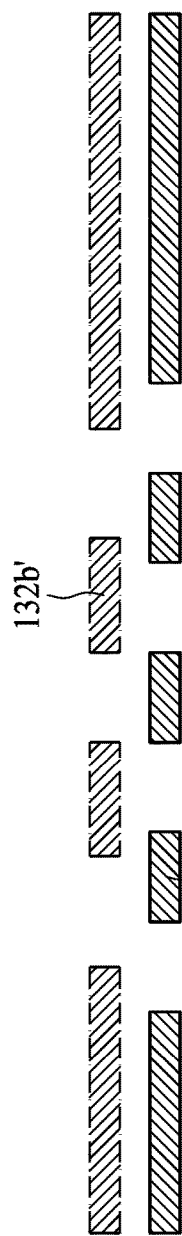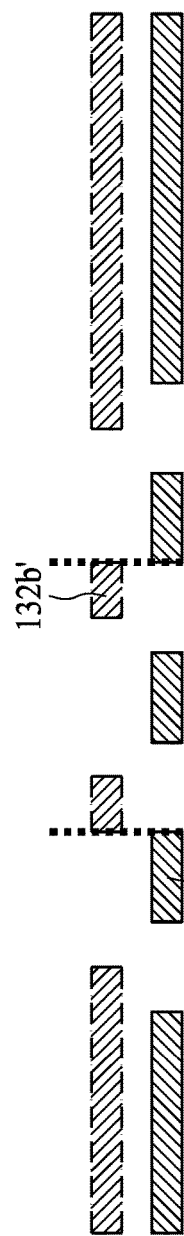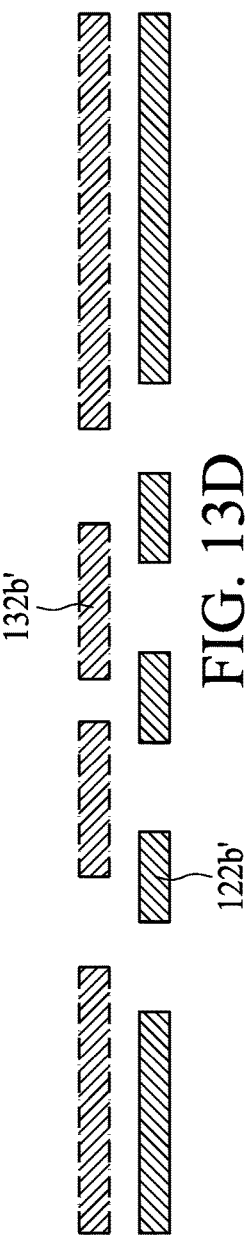

SEMICONDUCTOR PACKAGE STRUCTURE

BACKGROUND

1. Field of the Disclosure

The present disclosure relates to a semiconductor package structure, and in particular to a semiconductor package structure including a ground layer.

2. Description of Related Art

Package sawing is a step in the manufacture of a semiconductor package structure. Package sawing can be performed in, for example, a full-cut mode to separate the semiconductor wafer into package units. Afterwards, a conformal shielding layer is formed on surfaces of the package unit to create a semiconductor package structure.

Generally, a ground layer is exposed at side surfaces of the package unit after package sawing, so that the conformal shielding layer can contact the ground layer. If the ground layer is not exposed at side surfaces of the package unit, shielding performance of the semiconductor package structure will be degraded. It may therefore be desirable to have a semiconductor package structure that is able to enhance the shielding performance.

SUMMARY

According to some embodiments of the present disclosure, a semiconductor package structure includes a substrate. The substrate includes a first ground layer. The first ground layer has a body and a first tooth protruding from a side of the body. The first tooth has a first lateral side. The first lateral side of the first tooth is inclined relative to the side of the body in a top view of the first ground layer.

According to some embodiments of the present disclosure, a semiconductor package structure includes a substrate. The substrate includes a first sub-unit separable from a second sub-unit by a singulation street (or saw street). The first sub-unit includes a ground layer. The ground layer includes a body, a first tooth and a second tooth. The first tooth protrudes from a side of the body and has a first front side in the singulation street. The second tooth protrudes from the body and has a second front side in the singulation street. The second front side is positioned farther than the first front side into the singulation street.

BRIEF DESCRIPTION OF THE DRAWINGS

Aspects of the present disclosure are readily understood from the following detailed description when read with the accompanying figures. It should be noted that various features may not be drawn to scale. In fact, the dimensions of the various features may be arbitrarily increased or reduced for clarity of discussion.

FIG. 5A is a top view of a ground layer in accordance with some embodiments of the present disclosure.

FIG. 5B, FIG. 5C and FIG. 5D are cross-sectional views of the ground layer in accordance with some embodiments of the present disclosure.

FIG. 7A is a top view of a ground layer in accordance with some embodiments of the present disclosure.

FIG. 7B, FIG. 7C, FIG. 7D, FIG. 7E and FIG. 7F are cross-sectional views of the ground layer in accordance with some embodiments of the present disclosure.

FIG. 8A is a top view of ground layers in accordance with some embodiments of the present disclosure.

FIG. 8B, FIG. 8C, FIG. 8D, FIG. 8E and FIG. 8F are cross-sectional views of the ground layers in accordance with some embodiments of the present disclosure.

FIG. 9A is a top view of ground layers in accordance with some embodiments of the present disclosure.

FIG. 9B, FIG. 9C, FIG. 9D, FIG. 9E and FIG. 9F are cross-sectional views of the ground layers in accordance with some embodiments of the present disclosure.

FIG. 10A is a top view of ground layers in accordance with some embodiments of the present disclosure.

FIG. 10B, FIG. 10C, FIG. 10D, FIG. 10E and FIG. 10F are cross-sectional views of the ground layers in accordance with some embodiments of the present disclosure.

FIG. 11A is a top view of ground layers in accordance with some embodiments of the present disclosure.

FIG. 11B and FIG. 11C are cross-sectional views of the ground layers in accordance with some embodiments of the present disclosure.

FIG. 13A is a top view of ground layers in accordance with some embodiments of the present disclosure.

FIG. 13B, FIG. 13C and FIG. 13D are cross-sectional views of the ground layers in accordance with some embodiments of the present disclosure.

Figure 1A:
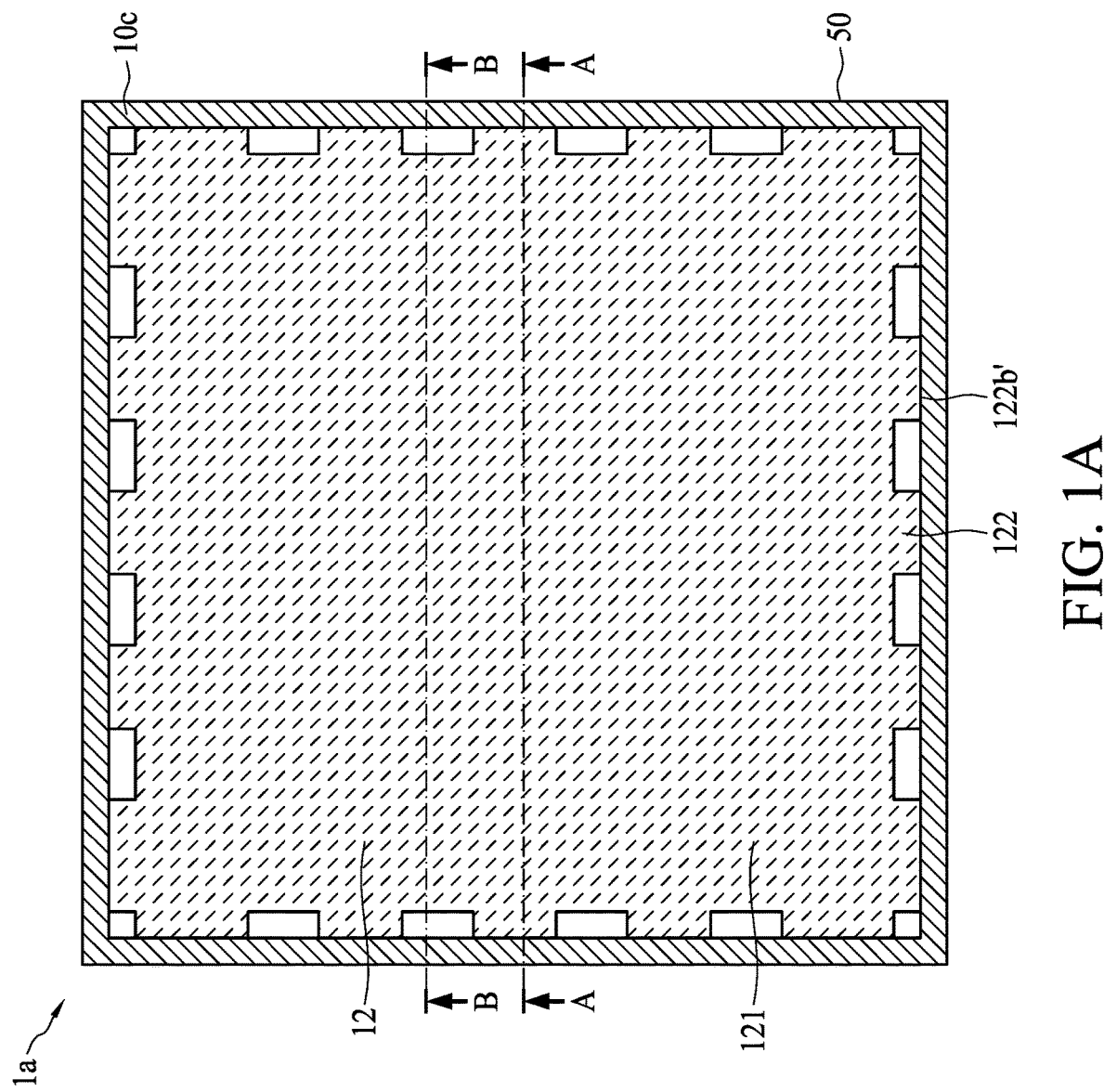
FIG. 1A is a top view of a semiconductor package structure in accordance with some embodiments of the present disclosure.

Common reference numerals are used throughout the drawings and the detailed description to indicate the same or similar components. The present disclosure will be more apparent from the following detailed description taken in conjunction with the accompanying drawings.

DETAILED DESCRIPTION

The following disclosure provides many different embodiments, or examples, for implementing different features of the provided subject matter. Specific examples of components and arrangements are described below. These are, of course, merely examples and are not intended to be limiting. In the present disclosure, reference to the formation or disposal of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Embodiments of the present disclosure are discussed in detail below. It should be appreciated, however, that the present disclosure provides many applicable concepts that can be embodied in a wide variety of specific contexts. The specific embodiments discussed are merely illustrative and do not limit the scope of the disclosure.

FIG. 1A is a top view of a semiconductor package structure 1a in accordance with some embodiments of the present disclosure. The semiconductor package structure 1a includes a ground layer 12 and a shielding layer 50. The ground layer 12 may include a body 121 and multiple teeth 122. Each one of teeth 122 protrudes from the body 121. The shielding layer 50 surrounds the ground layer 12. Each one of teeth 122 has a side 122b' in contact with the shielding layer 50.

Figure 1B:
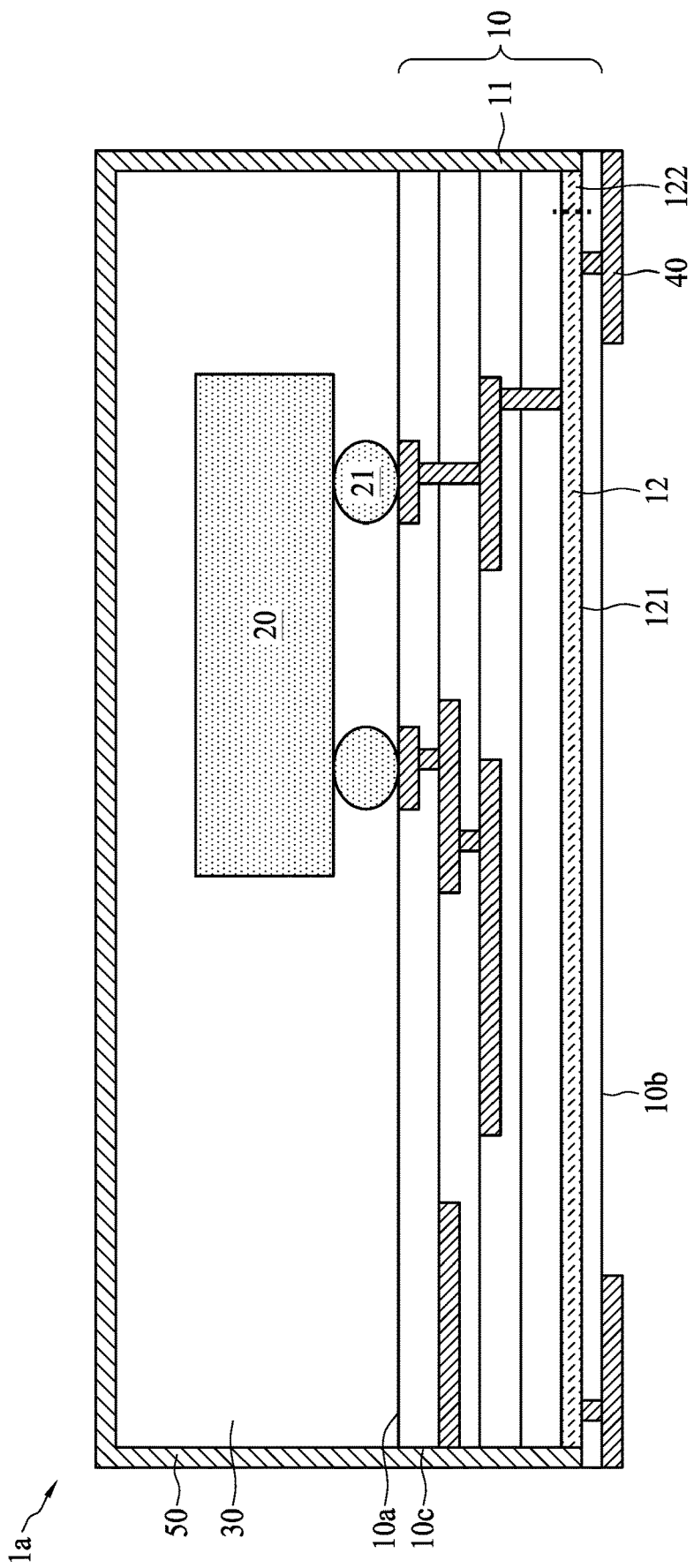
FIG. 1B is a cross-sectional view along line A-A of the semiconductor package structure shown in FIG. 1A in accordance with some embodiments of the present disclosure.

FIG. 1B is a cross-sectional view along line A-A of the semiconductor package structure 1a in accordance with some embodiments of the present disclosure. The semiconductor package structure 1a includes a substrate 10. In some embodiments, the substrate 10 may include silicon substrate or other semiconductor substrate. In some embodiments, the substrate 10 is formed of, for example, a printed circuit board, such as a paper-based copper foil laminate, a composite copper foil laminate, or a polymer-impregnated glass-fiber-based copper foil laminate. In some embodiments, the substrate 10 can be replaced by other suitable carriers, such as a lead frame.

The substrate 10 includes a surface 10a and a surface 10b opposite to the surface 10a. The substrate 10 further includes a surface 10c that extends from the surface 10a to the surface 10b. The surface 10a may also be referred to as an upper surface of the substrate 10; the surface 10b may also be referred to as a bottom surface of the substrate 10; and the surface 10c may also be referred to as a lateral surface of the substrate 10.

The substrate 10 may include a redistribution layer (RDL) 11. The RDL 11 may include metal traces and vias embedded in one or more dielectric layers. The RDL 11 may be configured to electrically connect conductive components.

The substrate 10 includes the ground layer 12. The ground layer 12 includes the body 121 and the teeth 122. The ground layer 12 is electrically connected to the RDL 11.

The semiconductor package structure 1a may include an electronic component 20. The electronic component 20 may be disposed on the surface 10a of the substrate 10. The electronic component 20 may be or may include an integrated circuit (IC). The electronic component 20 may be a general purpose processor, microprocessor, or microcontroller, or another type of programmable component such as a field programmable gate array (FPGA), or other controller such as an application-specific IC (ASIC).

The semiconductor package structure 1a may include a plurality of bumps 21. The bumps may be configured to electrically connect the electronic component 20 and the RDL 11. In some embodiments, the bump 21 is a solder ball (e.g., Sn ball).

The semiconductor package structure 1a may include a package body 30. The package body 30 covers the electronic component 20 and the substrate 10. The package body 30 is an encapsulant and may include insulation or dielectric material. In some embodiments, the package body 30 is made of molding material that may include, for example, a Novolac-based resin, an epoxy-based resin, a silicone-based resin, or other another suitable encapsulant. Suitable fillers may also be included, such as powdered $SiO_2$.

The semiconductor package structure 1a may include an electrode 40. The electrode 40 is disposed on the surface 10b of the substrate 10. The electrode 40 may be electrically connected to the ground. The electrode 40 is electrically connected to the ground layer 12. The electrode 40 may include or be made of metal materials, such as copper (Cu), silver (Ag), aluminum (Al), gold (Au), or an alloy thereof.

The semiconductor package structure 1a may include the shielding layer 50. The shielding layer 50 may be configured to shield electric fields, reducing electromagnetic radiation that may interfere with the electronic component 20 or other electronic components. The shielding layer 50 covers the package body 30 and the substrate 10. In some embodiments, the shielding layer 50 is in contact with the surface 10c of the substrate 10. As shown in FIG. 1A and FIG. 1B, each one of teeth 122 protrudes from the body 121 toward the shielding layer 50. In some embodiments, the tooth 122 is in contact with the shielding layer 50.

Figure 1C:
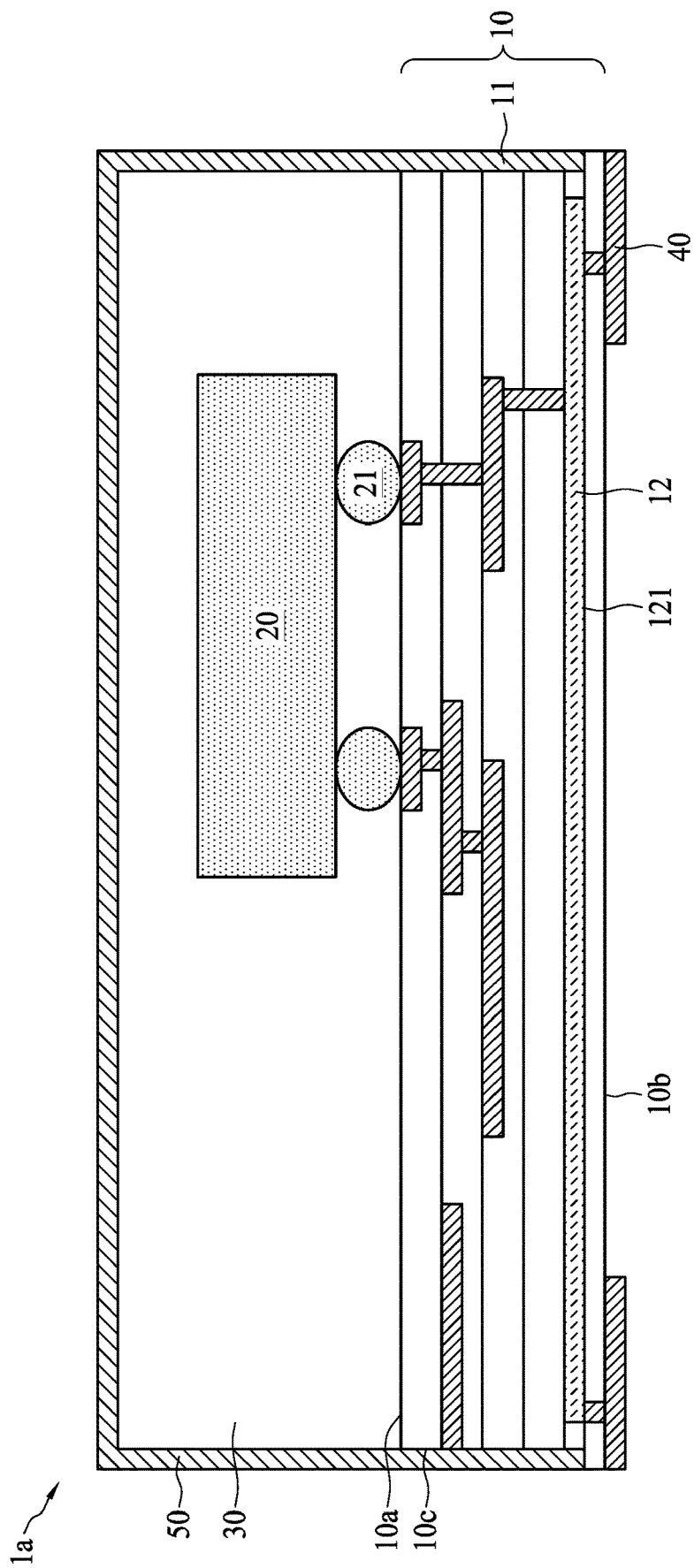
FIG. 1C is a cross-sectional view along line B-B of the semiconductor package structure shown in FIG. 1A in accordance with some embodiments of the present disclosure.

FIG. 1C is a cross-sectional view along line B-B of the semiconductor package structure 1a in accordance with some embodiments of the present disclosure. In this cross-section, no tooth 122 is in contact with the shielding layer 50. The dielectric layer of the RDL 11 may be filled between the body 121 and the shielding layer 50.

Figure 2:
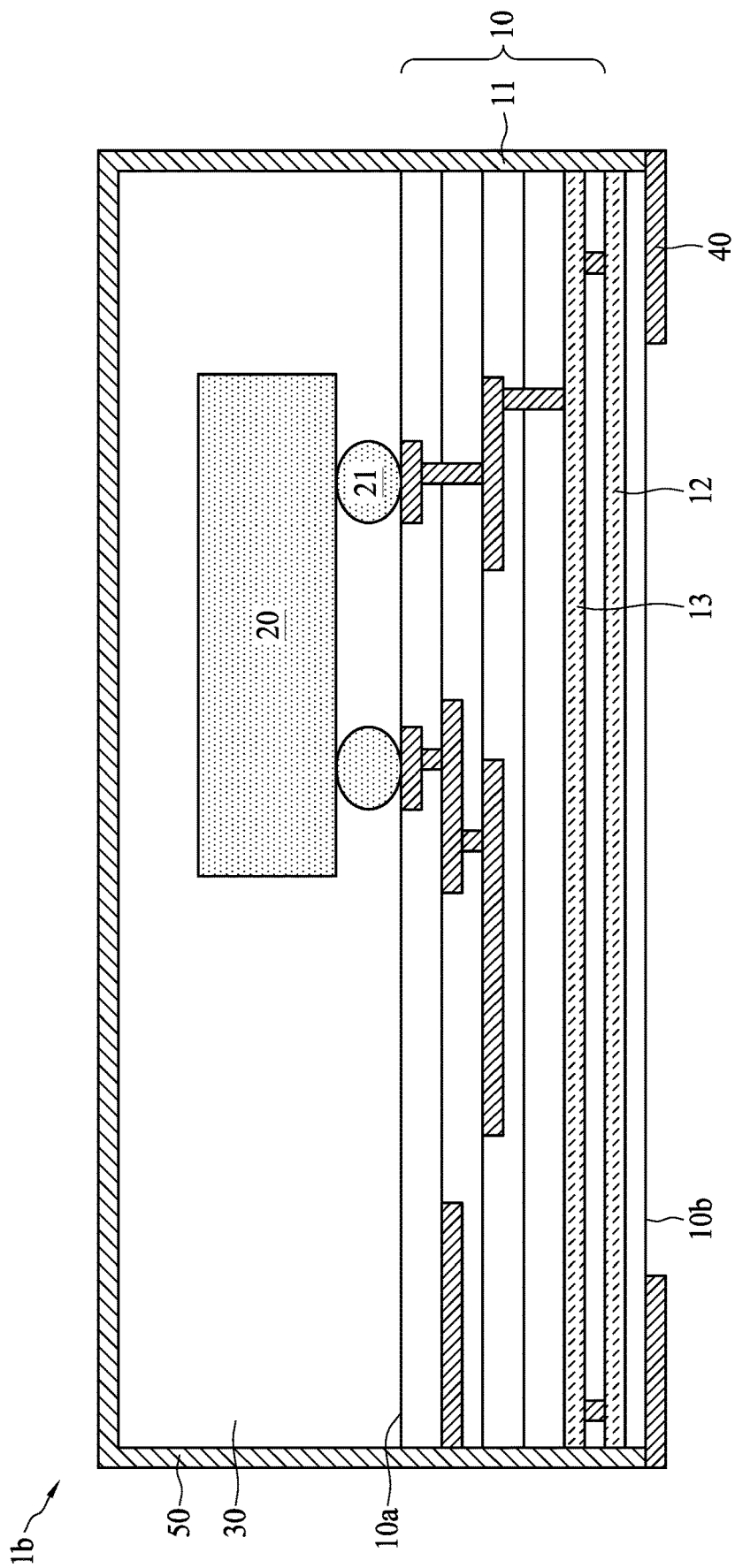
FIG. 2 is a cross-sectional view of a semiconductor package structure in accordance with some embodiments of the present disclosure.

FIG. 2 is a cross-sectional view of the semiconductor package structure 1b in accordance with some embodiments of the present disclosure. The semiconductor package structure 1b of FIG. 2 has a structure similar to that of the semiconductor package structure 1a of FIG. 1B except that the semiconductor package structure 1b further includes a ground layer 13. The ground layer 13 may be disposed on the ground layer 12 and electrically connected to the electrode 40. In some embodiments, the ground layer 13 includes a body and multiple teeth (not shown in FIG. 2) protruding from the body. In some embodiments, the ground layer 13 is in contact with the shielding layer 50. The material of the ground layer 13 may be similar to or the same as that of the ground layer 12.

Figure 3:
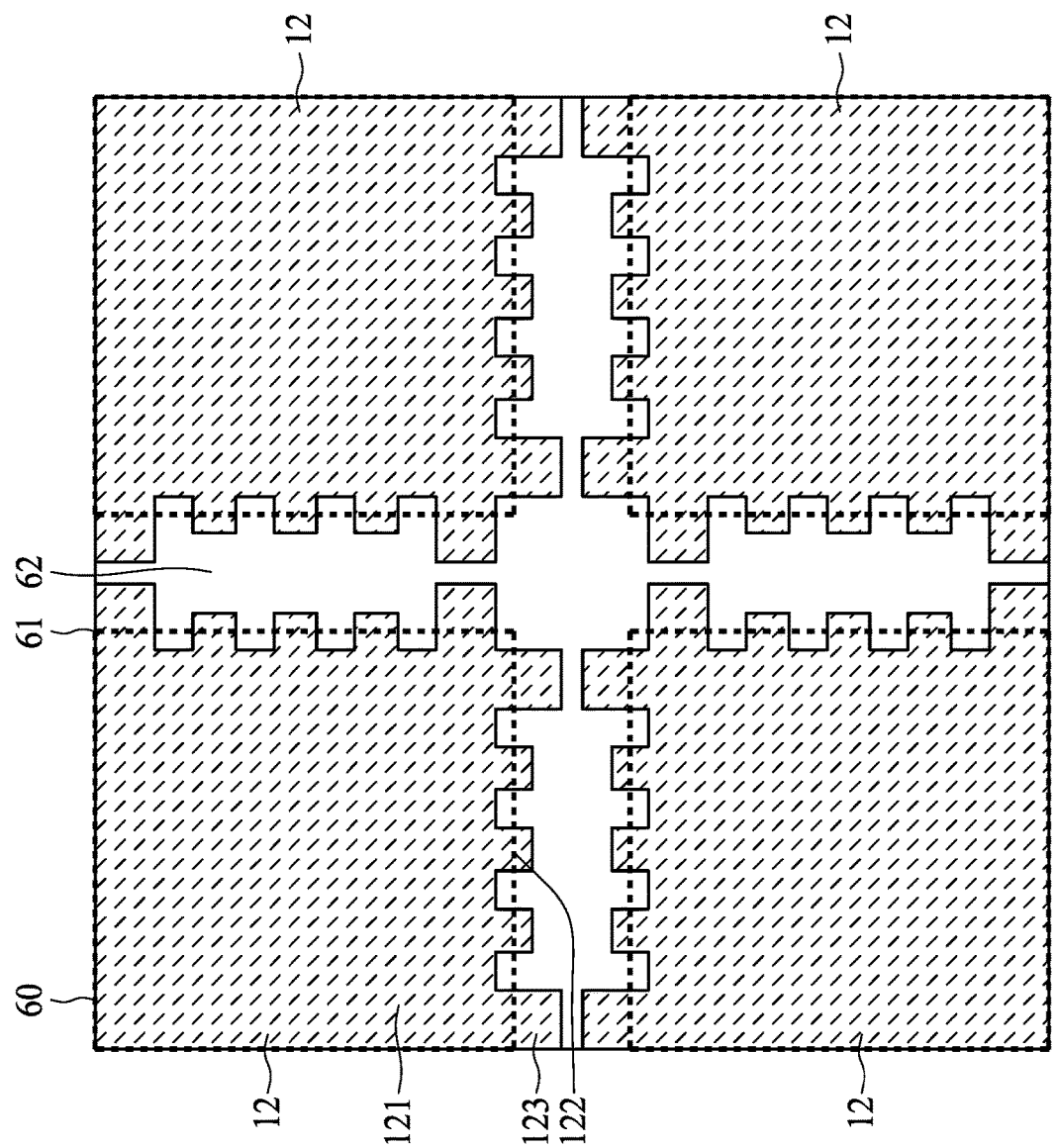
FIG. 3 is a top view of a semiconductor substrate in accordance with some embodiments of the present disclosure.

FIG. 3 is a top view of a semiconductor substrate 60 in accordance with some embodiments of the present disclosure. As shown in FIG. 3, the semiconductor substrate 60 includes multiple sub-units 61 and singulation streets 62. Two adjacent sub-units 61 are separated from each other by one singulation street 62.

Each one of sub-units 61 may have a structure similar to or the same as the semiconductor package structure, such as semiconductor package structure 1a or 1b, except that the semiconductor package structure 1a or 1b further includes the shielding layer 50. After a singulation process is performed, each of the sub-units 61 is separated from the others. Next, the shielding layer 50 may be formed on the sub-unit 60 to produce the semiconductor package structure.

Each one of sub-units 61 may include a ground layer 12. The ground layer 12 may include a plurality of teeth 122 and 123. The teeth 122 and 123 may protrude from the body 121 at different lengths. As shown in FIG. 3, the tooth 122 extends from the body 121 to the singulation street 62 at a lesser length. The tooth 123 extends from the body 121 to the singulation street 62 at a greater length. A portion of the tooth 122 is positioned in the singulation street 62. A portion of the tooth 123 is positioned in the singulation street 62. The portion of the ground layer 12 will be cut off after the singulation process is performed. After the sub-unit 61 is singulated, the pattern of the ground layer 12 may become the pattern shown in FIG. 1A.

Ideally, the semiconductor substrate 60 should be singulated along the boundary, which is represented by a dashed line, of the sub-unit 61. However, in practical, the sub-unit 61 is singulated with deviation so that the ground layer 12 may be not exposed from the substrate of the sub-unit 61. If the ground layer 12 is not exposed from the substrate of the sub-unit 61, the shielding layer 50 cannot be in contact with the ground layer 12, reducing the yield of the semiconductor package structures.

In some embodiments, the ground layer 12 includes at least one tooth 122, configured to determine whether the semiconductor substrate 60 is appropriately singulated. That is, the at least one tooth 122 facilitates the inspection of the pattern of singulated ground layer 12, which in turn can assist in optimizing the manufacturing process, and thus improving the yield of the semiconductor package structures. The details are discussed as follows.

Figure 4A:
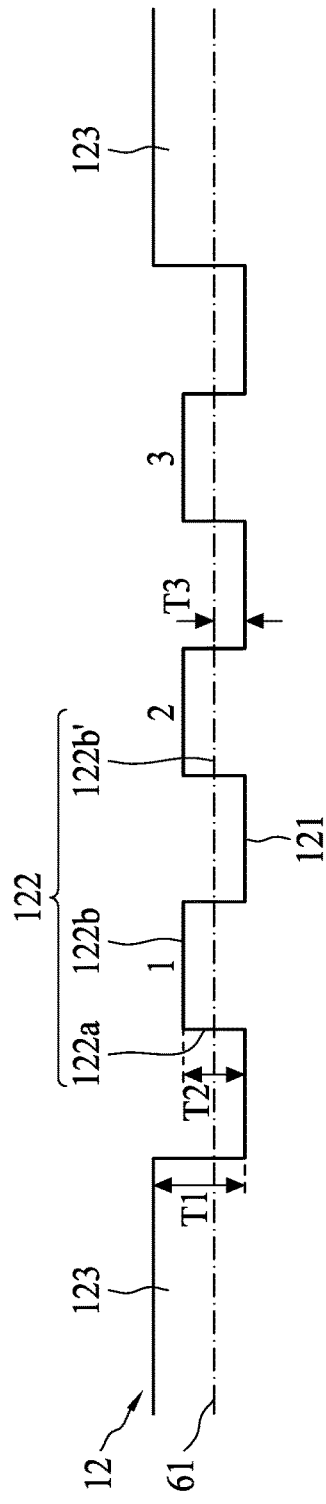
FIG. 4A is a top view of a ground layer in accordance with some embodiments of the present disclosure.

FIG. 4A is a portion of a top view of the ground layer 12 in accordance with some embodiments of the present disclosure. In some embodiments, the ground layer 12 may include at least one tooth 122. The tooth 122 is configured to determine whether a deviation, if any, of the singulation process is within the specification. In some embodiments, the ground layer 12 may include at least one tooth 123. The tooth 123 may be regarded as a reference tooth. The number of teeth 122 and 123 can be modified according to applications. The tooth 122 may be disposed between the teeth 123. However, the presented disclosure is not intended to be so limited.

As shown in FIG. 4A, the tooth 123 may protrude from a side of the body 121 by a length T1. In addition, the tooth 122 may protrude from the side of the body 121 by a length T2. Moreover, the boundary of the sub-unit 61 may have a length T3 from the side of the body 121. The side of the body 121 can be defined as a side of the ground layer 12 positioned between two teeth, such as between two teeth 122 or between the teeth 122 and 123. In some embodiments, the length T1 is greater than the length T2, and the length T2 is greater than the length T3. For example, the length T1 may be in a range from about 100 μm to about 150 μm. In addition, the length T2 may be in a range from about 50 μm to about 90 μm. Further, the length T3 may be in a range from about 30 μm to about 70 μm.

In some embodiments, the tooth 122 includes a side 122*a* and a side 122*b*. The side 122*a* can also be referred to as a lateral side of the tooth 122, and the side 122*b* can also be referred to as a front side of the tooth 122. The side 122*b'* is a front side of the tooth 122 after the sub-unit 61 is singulated. In some embodiments, the side 122*a* is substantially perpendicular to the side 122*b*. In some embodiments, the side 122*a* is substantially perpendicular to the side of the body 121.

Figure 4B:
FIG. 4B, FIG. 4C and FIG. 4D are cross-sectional views of the ground layer in accordance with some embodiments of the present disclosure.
Figure 4C:
Figure 4D:

FIG. 4B, FIG. 4C and FIG. 4D illustrate a pattern of the ground layer 12 after the sub-unit 61 is singulated in different cases. As shown in FIG. 4B, if the sub-unit 61 is cut too shallow, for example, if a cutting knife cuts a region between the front side of the tooth 123 and the side 122*b* of the tooth 122, the tooth 122 cannot be exposed from the substrate of the sub-unit 61. As a result, the shielding layer 50 cannot be in contact with the tooth 122. The pattern of the ground layer 12 shown in FIG. 4B means that the deviation of the singulation process is out of specification, and the cutting knife should be adjusted to be closer to the sub-unit 61 in subsequent singulation.

As shown in FIG. 4C, if the cutting knife cuts a region between the side 122*b* of the tooth 122 and the side of the body 121, the side 122*b'* will be exposed from the substrate of the sub-unit 61. As a result, the shielding layer 50 can be in contact with the tooth 122. That is, the pattern of the ground layer 12 shown in FIG. 4C means that the deviation of the singulation process is within the specification.

As shown in FIG. 4D, if the sub-unit 61 is cut too deep, for example, if the cutting knife cuts a region within the side of the body 121, the teeth 122 and 123 will be cut off after the singulation process. The pattern of the ground layer 12 shown in FIG. 4D means that another adjacent sub-unit 61 is cut too shallow and the tooth 122 of another adjacent sub-unit 61 will not be exposed from the substrate. Therefore, the deviation of the singulation process is out of specification, and the cutting knife should be adjusted to be farther from the sub-unit 61 in subsequent singulation.

As mentioned, the design of the ground layer 12 shown in FIG. 4A can assist in fine tuning the singulation process, thereby increasing the yield of the semiconductor package structures.

FIG. 5A is a portion of a top view of the ground layer 12 in accordance with some embodiments of the present disclosure. In some embodiments, the ground layer 12 includes a tooth 124. The tooth 124 may be disposed between two teeth 122. However, the presented disclosure is not intended to be so limited. The tooth 124 includes a side 124*a* and a side 124*b*. The side 124*a* protrudes from the body 121. In some embodiments, the side 124*a* is substantially perpendicular to the side 122*a*. In some embodiments, the side 124*b* is positioned farther than the side 122*b* into the singulation street 62. That is, the tooth 124 protrudes from the body by a length greater than the tooth 122 protrudes from the body.

FIG. 5B, FIG. 5C and FIG. 5D illustrate the pattern of the ground layer 12 after the sub-unit 61 is singulated in different cases. As shown in FIG. 5B, the sub-unit 61 is cut too shallow, so the side 124*b'* is exposed from the substrate of the sub-unit 61, while the side 122*b'* is not. That is, the deviation of the singulation process is out of specification.

As shown in FIG. 5C, if the cutting knife cuts a region between the side 122*b* of the tooth 122 and the side of the body 121, the side 122*b'* and the side 124*b'* will be exposed from the substrate of the sub-unit 61. As a result, the shielding layer 50 can be in contact with the teeth 122 and 124. That is, the pattern of the ground layer 12 shown in FIG. 5C means that the deviation of the singulation process is within the specification.

As shown in FIG. 5D, if the sub-unit 61 is cut too deep, the teeth 122, 123 and 124 will be cut off after the singulation process. The pattern of the ground layer 12 shown in FIG. 5D means that the deviation of the singulation process is out of specification. In this embodiment, inspecting the number of the sides 122*b'* of the ground layer 12 can assist in determining whether the singulation process should be modified.

Figure 6A:
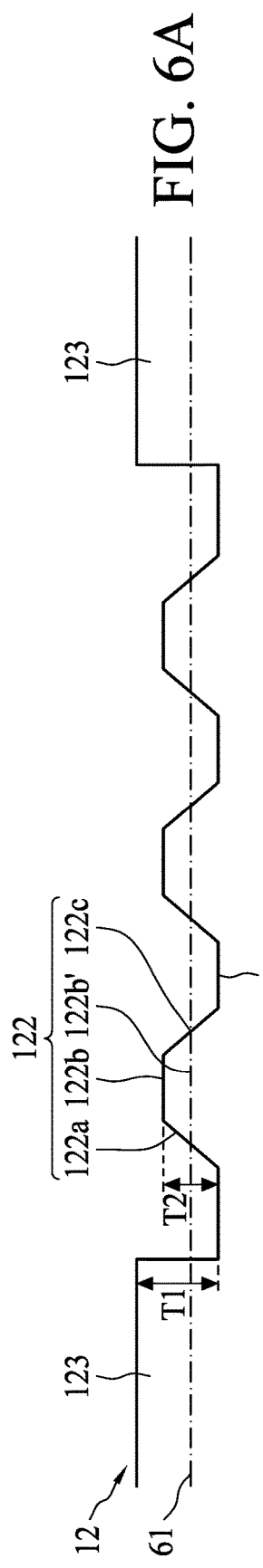
FIG. 6A is a top view of a ground layer in accordance with some embodiments of the present disclosure.

FIG. 6A is a portion of a top view of the ground layer 12 in accordance with some embodiments of the present disclosure. In some embodiments, the tooth 122 includes at least one inclined side 122*a*. In some embodiments, the side 122a is inclined relative to the side of the body 121. In some embodiments, the side 122a is inclined relative to the side 122b. The term "incline" in the present disclosure indicates that an angle formed by two sides exceeds 0 and is smaller than 90°. In some embodiments, the tooth 122 tapers off from the side of the body 121 to the side 122b. In some embodiments, the tooth 122 includes a side 122c that may be inclined relative to the side of the body 121. In some embodiments, the side 122c may be perpendicular to the side of the body 121.

Figure 6B:
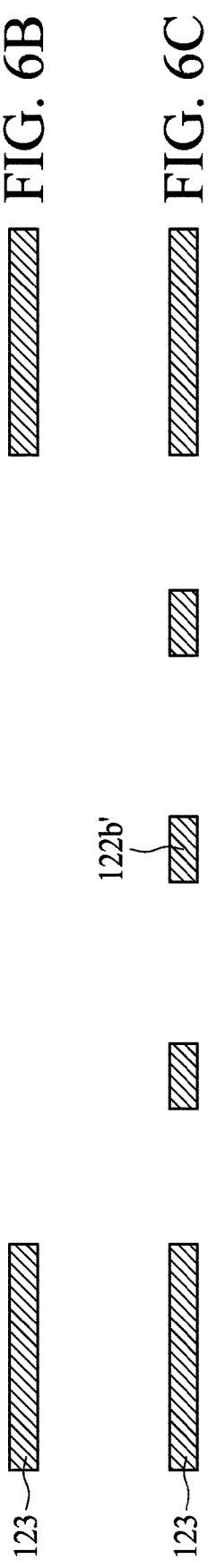
FIG. 6B, FIG. 6C, FIG. 6D, FIG. 6E and FIG. 6F are cross-sectional views of the ground layer in accordance with some embodiments of the present disclosure.

FIG. 6B, FIG. 6C, FIG. 6D, FIG. 6E and FIG. 6F illustrate a pattern of the ground layer 12 after the sub-unit 61 is singulated in different cases. As shown in FIG. 6B, if the sub-unit 61 is cut too shallow, the side 122b' is not exposed from the substrate of the sub-unit 61. That is, the deviation of the singulation process is out of specification.

Figure 6C:
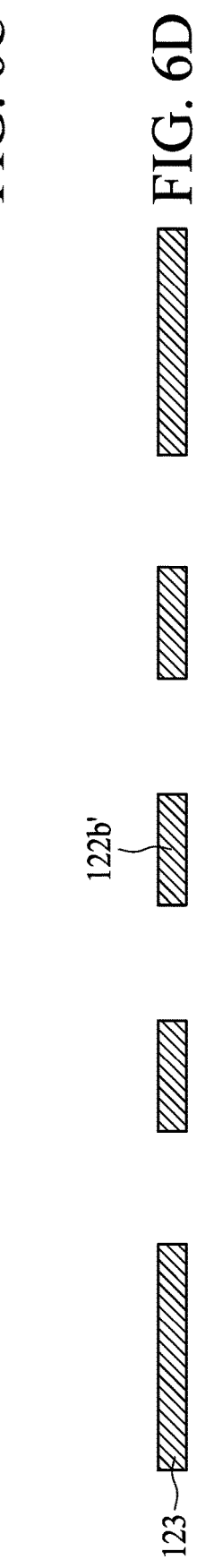
Figure 6D:
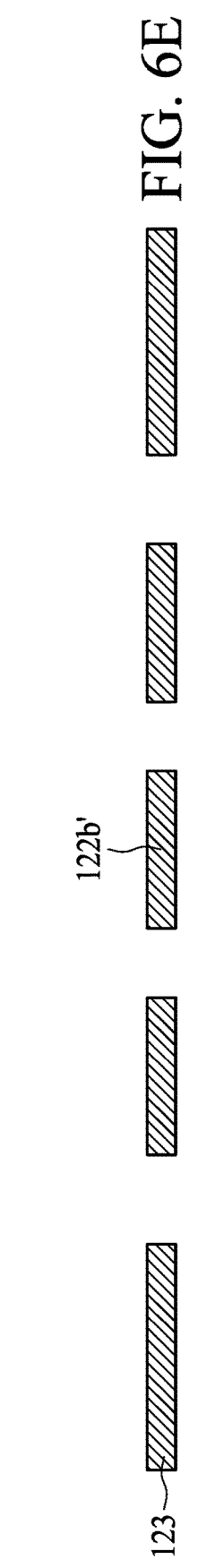
Figure 6E:
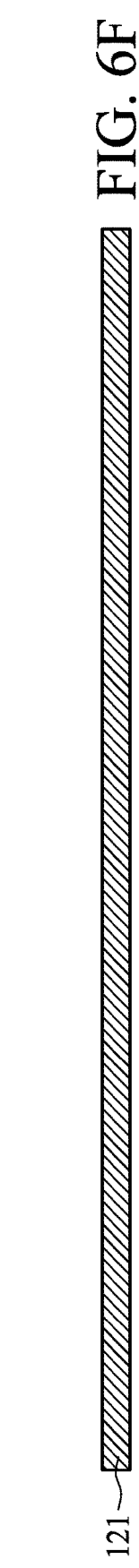

As shown in FIG. 6C, FIG. 6D and FIG. 6E, as the cutting knife cuts the sub-unit 61 in different positions, the side 122b' exposed from the substrate has different lengths. For example, the pattern shown in FIG. 6C means that the sub-unit 61 is cut shallower than the sub-unit with a pattern shown in FIG. 6D. Similarly, the pattern shown in FIG. 6E means that the sub-unit 61 is cut deeper than the sub-unit with a pattern shown in FIG. 6D. Although the pattern of the ground layer 12 shown in FIG. 6C, FIG. 6D and FIG. 6E means the deviation of the singulation process is within specification, the singulation process can be further modified according to the length of the side 122b'.

Figure 6F:

As shown in FIG. 6F, if the sub-unit 61 is cut too deep, the teeth 122 and 123 are cut off after the singulation process. That is, the deviation of the singulation process is out of specification. In this embodiment, the inclined side 122a of the ground layer 12 can further assist in fine tuning the singulation process.

FIG. 7A is a portion of a top view of the ground layer 12 in accordance with some embodiments of the present disclosure. In some embodiments, the ground layer 12 includes at least one tooth 122 and at least one tooth 124. In some embodiments, the tooth 122 includes at least one side 122a inclined relative to the side of the body 121. In some embodiments, the tooth 124 includes a side 124a perpendicular to the side of the body 121. In some embodiments, the side 124b of the tooth 124 is positioned farther from the side 122b of the tooth 122 into the singulation street 62.

FIG. 7B, FIG. 7C, FIG. 7D, FIG. 7E and FIG. 7F illustrate a pattern of the ground layer 12 after the sub-unit 61 is singulated in different cases. As shown in FIG. 7B, if the sub-unit 61 is cut too shallow, the side 122b' and the side 124b' are not exposed from the substrate of the sub-unit 61. That is, the deviation of the singulation process is out of specification.

As shown in FIG. 7C, FIG. 7D and FIG. 7E, as the cutting knife cuts the sub-unit 61 in different positions, the side 122b' exposed from the body 121 has different lengths. However, the side 124b' has a fixed length if the deviation of the singulation process is within the specification. By comparing the length of the side 122b' against that of the side 124b', it may be determined whether the singulation process needs to be modified. For example, the pattern shown in FIG. 7C, where the length of the side 122b' is smaller than that of the side 124b', means that the sub-unit 61 is cut a little shallower, and the cutting knife should be adjusted to be closer to the sub-unit 61 in a subsequent singulation. In contrast, the pattern shown in FIG. 7E, where the length of the side 122b' exceeds that of the side 124b', means that the sub-unit 61 is cut a little deeper, and the cutting knife should be adjusted to be farther from the sub-unit 61 in a subsequent singulation.

As shown in FIG. 7F, if the sub-unit 61 is cut too deep, the teeth 122, 123 and 124 will be cut off after the singulation process. That is, the deviation of the singulation process is out of specification. In this embodiment, the tooth 124 can be regarded as a reference tooth, which assists in easily determining whether the sub-unit 61 is cut too shallow or too deep.

FIG. 8A is a portion of a top view of the ground layers 12 and 13 in accordance with some embodiments of the present disclosure. As shown in FIG. 8A, the ground layer 12 is represented by a solid line, and the ground layer 13 is represented by a dashed line. In some embodiments, the ground layer 12 includes at least one tooth 122, and the ground layer 13 includes at least one tooth 132. In some embodiments, the tooth 122 may be aligned with the tooth 132. In some embodiments, the tooth 122 has at least one side 122a inclined relative the side of the body 121. In some embodiments, the tooth 132 includes a side 132b perpendicular to the side of a body 131.

FIG. 8B, FIG. 8C, FIG. 8D, FIG. 8E and FIG. 8F illustrate the patterns of the ground layers 12 and 13 after the sub-unit 61 is singulated in different cases. As shown in FIG. 8B, if the sub-unit 61 is cut too shallow, the side 122b' and the side 132b' will be not exposed from the substrate of the sub-unit 61. That is, the deviation of the singulation process is out of specification, and the cutting knife should be adjusted to be closer to the sub-unit 61 in subsequent singulation.

As shown in FIG. 8C, FIG. 8D and FIG. 8E, as the cutting knife cuts the sub-unit 61 in different positions, the side 122b' exposed from the body has different lengths. However, the side 132b' has a fixed length if the deviation of the singulation process is within the specification. By comparing the length of the side 122b' against that of the side 132b', it may be determined whether the singulation process needs to be modified. For example, the pattern shown in FIG. 8C, where the length of the side 122b' is smaller than that of the side 132b', means that the sub-unit 61 is cut a little shallower, and the cutting knife should be adjusted to be closer to the sub-unit 61 in a subsequent singulation. In contrast, the pattern shown in FIG. 8E, where the length of the side 122b' exceeds that of the side 132b', means that the sub-unit 61 is cut a little deeper, and the cutting knife should be adjusted to be farther from the sub-unit 61 in a subsequent singulation.

As shown in FIG. 8F, if the sub-unit 61 is cut too deep, the teeth 122 and 132 will be cut off after the singulation process. That is, the deviation of the singulation process is out of specification. In this embodiment, the tooth 132 can be regarded as a reference tooth, which assists in easily determining whether the sub-unit 61 is cut too shallow or too deep.

FIG. 9A is a portion of a top view of the ground layers 12 and 13 in accordance with some embodiments of the present disclosure. In some embodiments, the ground layer 12 includes at least one tooth 122, and the ground layer 13 includes at least one tooth 132. In some embodiments, the teeth 122 may be staggered with the teeth 132. In some embodiments, each one of teeth 122 has at least one side 122a inclined relative to the side of the body 121. In some embodiments, each one of teeth 132 includes a side 132b perpendicular to the side of the body 131.

FIG. 9B, FIG. 9C, FIG. 9D, FIG. 9E and FIG. 9F illustrate the patterns of the ground layers 12 and 13 after the sub-unit 61 is singulated in different cases. As shown in FIG. 9B, if the sub-unit 61 is cut too shallow, the side 132b' will be exposed from the substrate of the sub-unit 61, while the side 122b' will not. That is, the deviation of the singulation process is out of specification.

As shown in FIG. 9C, FIG. 9D and FIG. 9E, as the cutting knife cuts the sub-unit 61 in different positions, the side 122b' exposed from the body has different lengths. However, the side 132b' has a fixed length if the singulation process is within the specification. In this embodiment, if the edge of the side 122b' is aligned with that of the side 132b' as shown in FIG. 9D, it means that the sub-unit 61 is singulated along its boundary. In this embodiment, if the side 122b' does not overlap with the side 132b' as shown in FIG. 9C, it means that the sub-unit 61 is cut a little shallower. In this embodiment, if the side 122b' partially overlaps with the side 132b' as shown in FIG. 9E, it means that the sub-unit 61 is cut a little deeper.

As shown in FIG. 9F, if the teeth 122 and 132 are cut off after the singulation process, it means that the deviation of the singulation process is out of specification. In this embodiment, the tooth 132 can be regarded as a reference tooth, which assists in easily determining whether the sub-unit 61 is cut too shallow or too deep.

FIG. 10A is a portion of a top view of the ground layers 12 and 13 in accordance with some embodiments of the present disclosure. In some embodiments, the ground layer 12 includes at least one tooth 122, and the ground layer 13 includes at least one tooth 132. In some embodiments, the teeth 122 may be staggered with the teeth 132. In some embodiments, each one of teeth 122 includes at least one side 122a inclined relative to the side of the body 121. In some embodiments, each one of teeth 132 includes at least one side 132a inclined relative to the side of the body 131.

FIG. 10B, FIG. 10C, FIG. 10D, FIG. 10E and FIG. 10F illustrate the patterns of the ground layers 12 and 13 after the sub-unit 61 is singulated in different cases. As shown in FIG. 10B, if the sub-unit 61 is cut too shallow, the side 122b' and side 132b' are not exposed from the substrate of the sub-unit 61. That is, the deviation of the singulation process is out of specification.

As shown in FIG. 10C, FIG. 10D and FIG. 10E, as the cutting knife cuts the sub-unit 61 in different positions, the side 122b' exposed from the body has different lengths, as does the side 132b'. In this embodiment, if the edge of the side 122b' is aligned with that of the side 132b' as shown in FIG. 10D, it means that the sub-unit 61 is singulated along its boundary. In this embodiment, if the side 122b' does not overlap with the side 132b' as shown in FIG. 10C, it means that the sub-unit 61 is cut a little shallower. In this embodiment, if the side 122b' partially overlaps with the side 132b' as shown in FIG. 10E, it means that the sub-unit 61 is cut a little deeper.

As shown in FIG. 10F, if the teeth 122 and 132 are cut off after the singulation process, the deviation of the singulation process is out of specification. In this embodiment, the tooth 132 can be regarded as a reference tooth, which assists in easily determining whether the sub-unit 61 is cut too shallow or too deep.

FIG. 11A is a portion of a top view of the ground layers 12 and 13 in accordance with some embodiments of the present disclosure. In some embodiments, the ground layer 12 includes multiple teeth 122, and the ground layer 13 includes multiple teeth 132. In some embodiments, the teeth 122 may have a profile same as that of the teeth 132. In some embodiments, the pitch P1 of the teeth 122 is different from the pitch P2 of the teeth 132. The first tooth 122 may be aligned with the first tooth 132, and the second tooth 122 may be misaligned with the second tooth 132.

FIG. 11B and FIG. 11C illustrate the patterns of the ground layers 12 and 13 after the sub-unit 61 is singulated in different cases. As shown in FIG. 11B, the ground layers 12 and 13 are aligned with each other, and the first side 122b' will be aligned with the first side 132b'. As shown in FIG. 11C, the ground layers 12 and 13 are misaligned with each other, and the first side 122b' is not aligned with the first side 132b'. In addition, the misalignment value between the ground layers 12 and 13 can be determined by inspecting which side 122b' has an edge aligned with that of the side 132b'.

Figure 12:
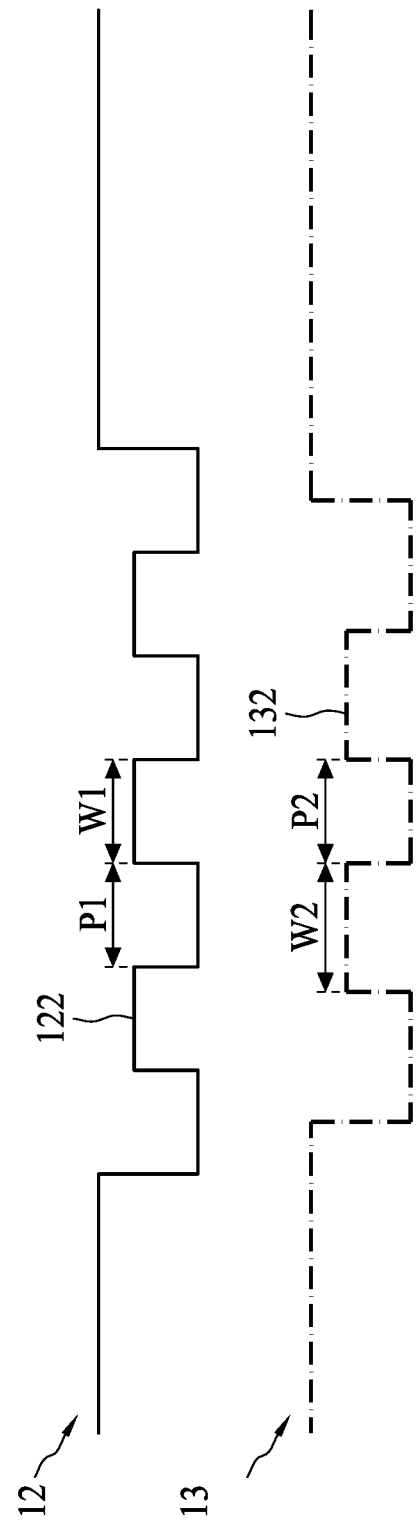
FIG. 12 is a top view of ground layers in accordance with some embodiments of the present disclosure.

FIG. 12 is a top view of the ground layers 12 and 13 in accordance with some embodiments of the present disclosure. As shown in FIG. 12, the ground layer 12 includes a plurality of teeth 122. The ground layer 13 includes a plurality of teeth 132. In some embodiments, the number of the teeth 122 is different from that of the teeth 132. The teeth 122 may have a pitch P1, and each one of teeth 122 may have a front side with a width W1. In some embodiments, the teeth 132 may have a pitch P2, and each one of teeth 132 may have a front side with a width W2. In some embodiments, the pitch P1 is equivalent to the pitch P2. In some embodiments, the width W1 is different from the width W2. In this embodiment, if every side 122b' partially overlaps with the side 132b', it means that there is a misalignment between the ground layers 12 and 13.

FIG. 13A is a portion of a top view of the ground layers 12 and 13 in accordance with some embodiments of the present disclosure. In some embodiments, the number of the teeth 122 is different from that of the teeth 132. In some embodiments, each one of teeth 122 has a side 122a perpendicular to the side of the body 121. In some embodiments, each one of teeth 132 has a side 132a inclined relative to the side of the body 131. In some embodiments, the pitch of the teeth 122 is different from that of the teeth 132.

FIG. 13B, FIG. 13C and FIG. 13D illustrate the patterns of the ground layers 12 and 13 after the sub-unit 61 is singulated in different cases. As the cutting knife cuts the sub-unit 61 in different positions, the side 132b' exposed from the substrate has different lengths. However, the side 122b' has a fixed length if the deviation of the singulation process is within the specification. If the pattern is that shown in FIG. 13C, every side 132b' does not overlap the side 122b', it means that the ground layer 12 is aligned with the ground layer 13. If the pattern is as shown in FIG. 13B or FIG. 13D, at least one side 132b' partially overlaps the side 122b', it means that the ground layer 12 is misaligned with the ground layer 13. In this embodiment, the misalignment value between the ground layers 12 and 13 can be determined by inspecting which side 122b' has an edge aligned with that of the side 132b'.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only and that practical implementations of the structures described herein can be spatially arranged in any orientation or manner, provided that the merits of embodiments of this disclosure are not deviated from by such an arrangement.

As used herein, the term "vertical" is used to refer to upward and downward directions, whereas the term "horizontal" refers to directions transverse to the vertical directions.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, a first numerical value can be deemed to be "substantially" the same or equal to a second numerical value if the first numerical value is within a range of variation of less than or equal to ±10% of the second numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no exceeding 5 μm, no exceeding 2 μm, no exceeding 1 μm, or no exceeding 0.5 μm. A surface can be deemed to be substantially flat if a displacement between the highest point and the lowest point of the surface is no exceeding 5 μm, no exceeding 2 μm, no exceeding 1 μm, or no exceeding 0.5 μm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity exceeding approximately 104 S/m, such as at least 105 S/m or at least 106 S/m. The electrical conductivity of a material ca sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit, and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A semiconductor package structure, comprising:
   a substrate including:
   a first ground layer, the first ground layer having a body and a first tooth protruding from a side of the body, the first tooth having a first lateral side, and the first lateral side of the first tooth being substantially perpendicular relative to the side of the body in a top view of the first ground layer; and
   a second ground layer disposed in the substrate over the first ground layer, the second ground layer having a second body and a third tooth protruding from a side of the second body.

2. The semiconductor package structure of claim 1, wherein the first tooth has a second lateral side opposite to the first lateral side, and the second lateral side of the first tooth is substantially perpendicular relative to the side of the body.

3. The semiconductor package structure of claim 1, wherein the first tooth has a front side electrically connected to a shielding layer.

4. The semiconductor package structure of claim 1, wherein the first ground layer has a second tooth, and the second tooth has a first lateral side and a second lateral side at least one of which is inclined relative to the side of the body.

5. A semiconductor package structure, comprising:
   a substrate including:
   a first ground layer, the first ground layer having a body and a first tooth protruding from a side of the body, the first tooth having a first lateral side, and the first lateral side of the first tooth being substantially perpendicular relative to the side of the body in a top view of the first ground layer;
   wherein the first ground layer has a second tooth, and the second tooth has a profile different from that of the first tooth.

6. A semiconductor package structure, comprising:
   a substrate including:
   a first ground layer, the first ground layer having a body and a first tooth protruding from a side of the body, the first tooth having a first lateral side, and the first lateral side of the first tooth being substantially perpendicular relative to the side of the body in a top view of the first ground layer;
   wherein the substrate includes a plurality of sub-units, a plurality of first ground layers and a plurality of singulation streets, wherein each sub-unit includes one of the first ground layers, a first sub-unit of the sub-units is adjacent to a second sub-unit of the sub-units, one of the singulation streets is between the first sub-unit and the second sub-unit and overlaps the first tooth of the first sub-unit and the second sub-unit.

7. The semiconductor package structure of claim 2, wherein the first tooth includes a front side extending from the first lateral side to the second lateral side in the top view of the first ground layer, wherein the front side is exposed from a lateral surface of the substrate.

8. The semiconductor package structure of claim 1, wherein a profile of the first tooth of the first ground layer is different from a profile of the third tooth of the second ground layer.

9. The semiconductor package structure of claim 1, wherein the first tooth of the first ground layer is staggered with the third tooth of the second ground layer.

10. The semiconductor package structure of claim 1, wherein the first tooth of the first ground layer is aligned with the third tooth of the second ground layer.

11. The semiconductor package structure of claim 1, wherein the third tooth has a first lateral side, and the first lateral side of the third tooth is inclined relative to the side of the second body.

12. The semiconductor package structure of claim 1, wherein the third tooth has a first lateral side, and the first lateral side of the third tooth is substantially perpendicular to the side of the second body.

13. The semiconductor package structure of claim 1, wherein the first tooth has a front side electrically connected to a shielding layer, the third tooth has a front side electrically connected to the shielding layer, and the front side of the first tooth is aligned with the front side of the third tooth.

14. The semiconductor package structure of claim 1, wherein the first tooth has a front side electrically connected to a shielding layer, the second tooth has a front side electrically connected to the shielding layer, and the front side of the first tooth is staggered with the front side of the third tooth.

15. A semiconductor substrate, comprising:
a substrate including a first sub-unit separable from a second sub-unit by a singulation street, the first sub-unit comprising a ground layer, the ground layer comprising:
a body; and
a first tooth protruding from a side of the body and having a first front side in the singulation street; and
a second tooth protruding from the side of the body and having a second front side in the singulation street, the second front side positioned farther than the first front side into the singulation street.

16. The semiconductor substrate of claim 15, wherein the first tooth has a first lateral side, and the first lateral side of the first tooth is inclined relative to the side of the body.

17. The semiconductor substrate of claim 15, wherein the second tooth has a first lateral side, and the first lateral side of the second tooth is substantially perpendicular to the side of the body.

18. The semiconductor substrate of claim 15, wherein the first tooth has a first lateral side, and the first lateral side of the first tooth is substantially perpendicular to the side of the body.

19. The semiconductor substrate of claim 15, wherein a length of the first front side in the direction of the side of the body is different from that of the second front side.

* * * * *